United States Patent [19]

Glover et al.

[11] Patent Number: 5,144,235
[45] Date of Patent: Sep. 1, 1992

[54] METHOD OF DECOMPOSING NMR IMAGES BY CHEMICAL SPECIES

[75] Inventors: Gary H. Glover, Menlo Park, Calif.; Erika Schneider, New Berlin, Wis.

[73] Assignee: General Electric Company, Milwaukee, Wis.

[21] Appl. No.: 566,199

[22] Filed: Aug. 10, 1990

[51] Int. Cl.⁵ .............................. G01R 33/20
[52] U.S. Cl. .................................... 324/309
[58] Field of Search ............... 324/300, 307, 309, 311, 324/313, 318, 322

[56] References Cited

U.S. PATENT DOCUMENTS

| | | | |
|---|---|---|---|
| 4,346,716 | 8/1982 | Carr | 128/653.1 |
| 4,468,621 | 8/1984 | Hinshaw | 324/309 |
| 4,806,867 | 2/1989 | Hanawa | 324/314 |

OTHER PUBLICATIONS

"Simple Proton Spectroscopic Imaging", W. Thomas Dixon, Radiology, 1984; 153: 189-194.
"Fatty Infiltration of the Liver: Demonstration by Proton Spectroscopic Imaging", Joseph K. T. Lee, et al., Radiology, 1984: 1535: 195-201.

Primary Examiner—Michael J. Tokar
Attorney, Agent, or Firm—Quarles & Brady

[57] ABSTRACT

A method of separating fat and water proton NMR images in the presence of local magnetic field inhomogeneities uses three images acquired with $\pi$, O, and $-\pi$ phase shift between the water and fat signals. A switch function is developed from the argument of the combined images to unambiguously identify the predominant chemical species of each pixel. Wrap arounds in the argument resulting from the limited range of trigonometric functions are treated first by subtracting a low order polynomial, fit to the phase image, to accentuate and remove wrap around discontinuities, and second by using trend analysis to detect and remove discontinuities caused by the wrap arounds.

11 Claims, 7 Drawing Sheets

FIG. 7
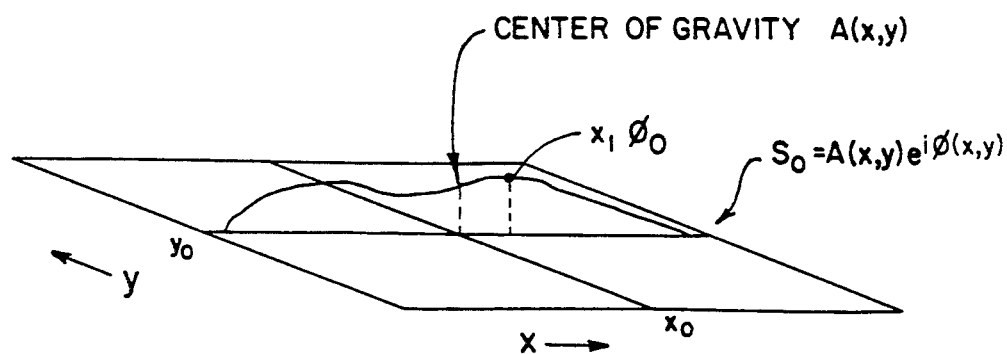
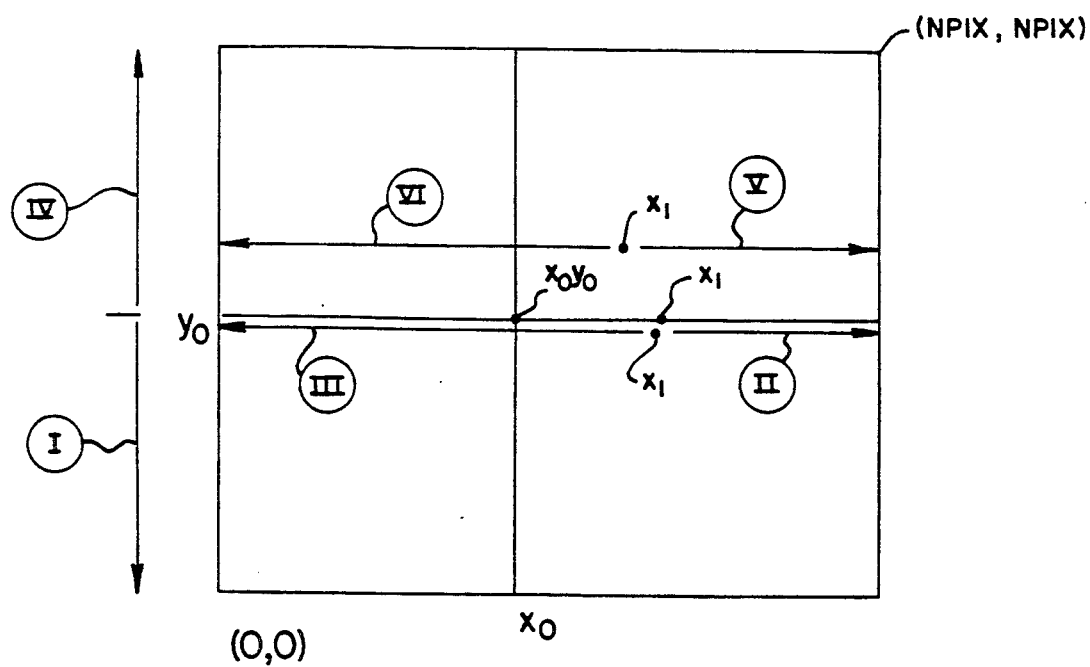
FIG. 8

METHOD OF DECOMPOSING NMR IMAGES BY CHEMICAL SPECIES

BACKGROUND OF THE INVENTION

This invention relates to nuclear magnetic resonance (NMR) imaging methods and apparatus and more particularly to a method of producing separate images of different chemical species using such imaging methods.

In an NMR imaging sequence, a uniform magnetic field $B_O$ is applied to an imaged object along the z axis of a Cartesian coordinate system, the origin of which is within the imaged object. The effect of the magnetic field $B_O$ is to align the object's nuclear spins along the z axis. In response to RF pulses of the proper frequency oriented within the x-y plane, the nuclei resonate at their Larmor frequencies according to the following equation:

$$\omega = \gamma B_O \tag{1}$$

where $\omega$ is the Larmor frequency, and $\gamma$ is the gyromagnetic ratio which is a property of the particular nucleus. Water, because of its relative abundance in biological tissue and the properties of its proton nuclei, is of principle concern in such imaging. The value of the gyromagnetic ratio $\gamma$ for protons in water is 4.26 kHz/Gauss and therefore in a 1.5 Tesla polarizing magnetic field $B_O$, the resonant or Larmor frequency of water protons is approximately 63.9 MHz.

Materials other than water, principally fat, are also to be found in biological tissue and have different gyromagnetic ratios. The Larmor frequency of protons in fat is approximately 203 Hz. higher than that of protons in water in a 1.5 Tesla polarizing magnetic field $B_O$. The difference between the Larmor frequencies of such different isotopes or species of the same nucleus, viz., protons, is termed chemical shift, reflecting the differing chemical environments of the two species.

In the well known slice selective RF pulse sequence, a z axis magnetic field gradient $G_z$ is applied at the time of the RF pulse so that only the nuclei in a slice through the object in an x-y plane are excited into resonance. After the excitation of the nuclei, magnetic field gradients are applied along the x and y axes and an NMR signal is acquired. The gradient along the x axis, $G_x$, causes the nuclei to precess at different resonant frequencies depending on their position along the x axis; that is, $G_x$ spatially encodes the precessing nuclei by frequency. Similarly, the y axis gradient, $G_y$, is incremented through a series of values and encodes y position into the rate of change of phase as a function of $G_y$ gradient amplitude, a process typically referred to as phase encoding. From this data set an image may be derived according to well known reconstruction techniques. A general description of one such image reconstruction technique based on the Fourier transform is contained in the book "Magnetic Resonance Imaging, Principles and Applications" by D. N. Kean and M. A. Smith. Images in other orientations can be generated by rotation of the gradient directions, as is well known in the art.

Often it is desired to "decompose" the NMR image into its several chemical shift components. In the exemplary case of protons, which will be used hereafter for illustration, it maybe desired to portray as separate images the water and fat components of the subject. One method of accomplishing this is to acquire two images $S_O$, and $S_{-1}$ with the fat and water components of the images in phase, and out of phase by $\pi$ radians, respectively (the "Dixon" technique). Adding and subtracting these images provides separate fat and water images. The phase shift between the fat and water components of the images may be controlled by timing the RF pulses of the NMR sequence so that the signal from the fat image evolves in phase with respect to the water by the proper angle of exactly $\pi$, before the NMR signal is acquired.

In the ideal case above, the frequency of the RF transmitter is adjusted to match the Larmor frequency of the water. If the polarizing magnetic field $B_O$ is uniform, this resonance condition is achieved through out the entire subject. Similarly, the out-of-phase condition ($\pi$ radians) for the fat component is achieved for all locations in the subject under homogeneous field conditions. In this case, the decomposition into the separate images is ideal in that fat is completely suppressed in the water image, and vice versa.

When the polarizing field is inhomogeneous, however, there are locations in the subject for which the water is not on resonance. In this case, the accuracy of the decomposition breaks down and the water and fat images contain admixtures of the two species. This derives from additional phase shifts of the NMR signal caused by the off resonance condition. The degree to which the off resonance condition holds is, in general, not known. The accuracy of such chemical shift "Dixon" techniques is therefore often unreliable.

Field inhomogeneities may result from improper adjustment or shimming of the polarizing magnetic field $B_O$, but are more typically the result of "demagnetization" effects caused by the variations in magnetic susceptibility of the imaged tissue, such as between soft tissue and air, or bone and soft tissue, which locally distort the polarizing magnetic field $B_O$. These demagnetization effects may be of short spatial extent but of high magnitude, and therefore may not be removed by conventional linear or higher order shimming techniques.

The influence of demagnetization may be accommodated, however, by an imaging technique that uses three images $S_O$, $S_1$, and $S_{-1}$, with the phase evolution times adjusted so that the fat and water components of the images in phase, out of phase by $\pi$, and out of phase by $-\pi$ respectively. The complex pixels in each of the three images after conventional reconstruction may be represented as follows:

$$S_O = (\rho_1 + \rho_2)e^{i\phi_O} \tag{2}$$

$$S_1 = (\rho_1 - \rho_2)e^{i(\phi + \phi_O)} \tag{3}$$

$$S_{-1} = (\rho_1 - \rho_2)e^{-i(\phi - \phi_O)} \tag{4}$$

where $\rho_1$ is the (real) relaxation weighted spin density and hence the amplitude of the pixel contributed by the water component, $\rho_2$ is the (real) relaxation weighted spin density or amplitude of the pixel contributed by the fat component, and $\phi_O$ is the phase shift common to all acquisitions that is caused by RF heterogeneity due to penetration effects, phase shifts between the RF transmitter and receiver, and other systematic components. These effects are independent of chemical shift but dependent on spatial location. In images $S_1$ and $S_{-1}$ the amplitudes $\rho_1$ and $\rho_2$ are subtracted because of the $\pi$ and $-\pi$ phases shift between the fat and water components as previously described. The phase shift $\phi$ is caused by the unknown resonance offset that results from $B_O$ heterogeneity. The phase offset $\phi_0$ may be eliminated from equations (2)-(4) from $S_O$, since the $\rho_i$ values are real quantities, by determining its argument $\phi_0$. The argument $\phi_0$ may then be eliminated from the equations (2)-(4) yielding:

$$S'_O = S_O e^{-i\phi_0} = (\rho_1 + \rho_2) \quad (2')$$

$$S'_1 = S_1 e^{-i\phi_0} = (\rho_1 - \rho_2)e^{i(\phi)} \quad (3')$$

$$S'_{-1} = S_{-1} e^{-i\phi_0} = (\rho_1 - \rho_2)e^{-i(\phi)} \quad (4')$$

The values of $\rho_1$ and $\rho_2$ may be determined from the measured values of $S_O'$, $S_1'$ and $S_{-1}'$ according to equations (2')-(4') as:

$$\rho_1 = (S_0' + s\sqrt{S_1'S_{-1}'})/2 \quad (5)$$

$$\rho_2 = (S_0' - s\sqrt{S_1'S_{-1}'})/2 \quad (6)$$

where s is a "switch function" which may be either $+1$ or $-1$ thus determining the sign of the square root.

The choice of the sign of the square roots is difficult because the demagnetization effects may cause abrupt changes in the local polarizing magnetic field $B_O$ which cause the switch function to change in value from pixel to pixel.

SUMMARY OF THE INVENTION

The present invention provides a method of determining the value of the switch function for each pixel necessary to unambiguously decompose an NMR image into separate images of different chemical species. The switch function is determined from the phase angle of a $B_O$ image, the phase angle normally being subject to "wrap around" every $2\pi$ radians. The present invention provides two methods of detecting and correcting this wrap around. These methods are preferably used as a first and second step in decomposing the NMR image.

The first method removes low spatial order phase shifts from the $B_O$ image by fitting to and subtracting a low order polynomial from the $B_O$ image. Occurrences of wrap arounds are reduced because the dynamic range of the resulting phase image is reduced.

Specifically, three complex NMR multi-pixel images $S_O$, $S_1$, and $S_{-1}$ are taken of a body with a first and second chemical species having relative phase shifts of 0, $\pi$, and $-\pi$ in the three images. The images are then combined to create an uncorrected $B_O$ image. A low order surface is fit to the continuous portions of the $B_O$ image and the difference between the low order surface and the $B_O$ image is calculated to produce a corrected $B_O$ image. Finally, a switch function is determined as a function of the corrected $B_O$ image. This switch function is used to identify the predominant chemical species of each pixel in the chemical species images.

Thus it is one object of the invention to produce a switch function that can unambiguously distinguish between chemical species in images decomposed by chemical species.

The fitting of the low order surface to the continuous portions of the $B_O$ image may be done by spatially differentiating the $B_O$ image to produce a differentiated image and producing a weighting function by comparing the value of the differentiated image at each pixel to a predetermined threshold and setting the weighting function for that pixel equal to zero if that threshold is passed for the purpose of identifying and discarding discontinuous wrap-around points. A differentiated polynomial may be fit to the differentiated $B_O$ image using the weighting function in a weighted curve fitting process. This differentiated polynomial is then integrated to produce the low order surface.

It is thus another object of the invention to provide a means for identifying the "wrap arounds" of the $B_O$ image and to extend the range of the $B_O$ image as is necessary to produce the switch function. The differentiation of the $B_O$ image makes the wrap around points easy to identify and the low order surface provides a baseline for subtracting from the $B_O$ image to reduce the wrap around problem.

The second method of correcting the $B_O$ image, which may follow the first method, predicts the phase of successive pixels from previous pixels. Wrap arounds are detected by differences between the predicted value and the actual value of the phase of that pixel.

In the second method, a starting pixel in the $B_O$ image is used for an initial phase value. The phase value of a neighbor pixel is predicted and compared to the actual phase value of the neighbor pixel. If the predicted value differs from the actual value by more than a predetermined threshold, the phase of the neighbor pixel is corrected by $2\pi$ to produce a corrected phase value. This process is repeated until a corrected phase value has been obtained over the entire image.

It is thus another object of the invention to provide a method of correcting wrap arounds in the $B_O$ image when the $B_O$ image may change rapidly and thus discontinuities are not readily distinguished by differentiation.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 7 is a three dimensional graph of the image $S_O$ along one y line showing the center of gravity and the maximum point $x_1$ used with the method of FIG. 5; and FIG. 8 is a graph of the image space of the image shown in FIG. 7 showing the direction of unwrapping from the center of gravity of the image at $X_O$ and $y_O$.

DETAILED DESCRIPTION OF THE INVENTION

Figure 1:
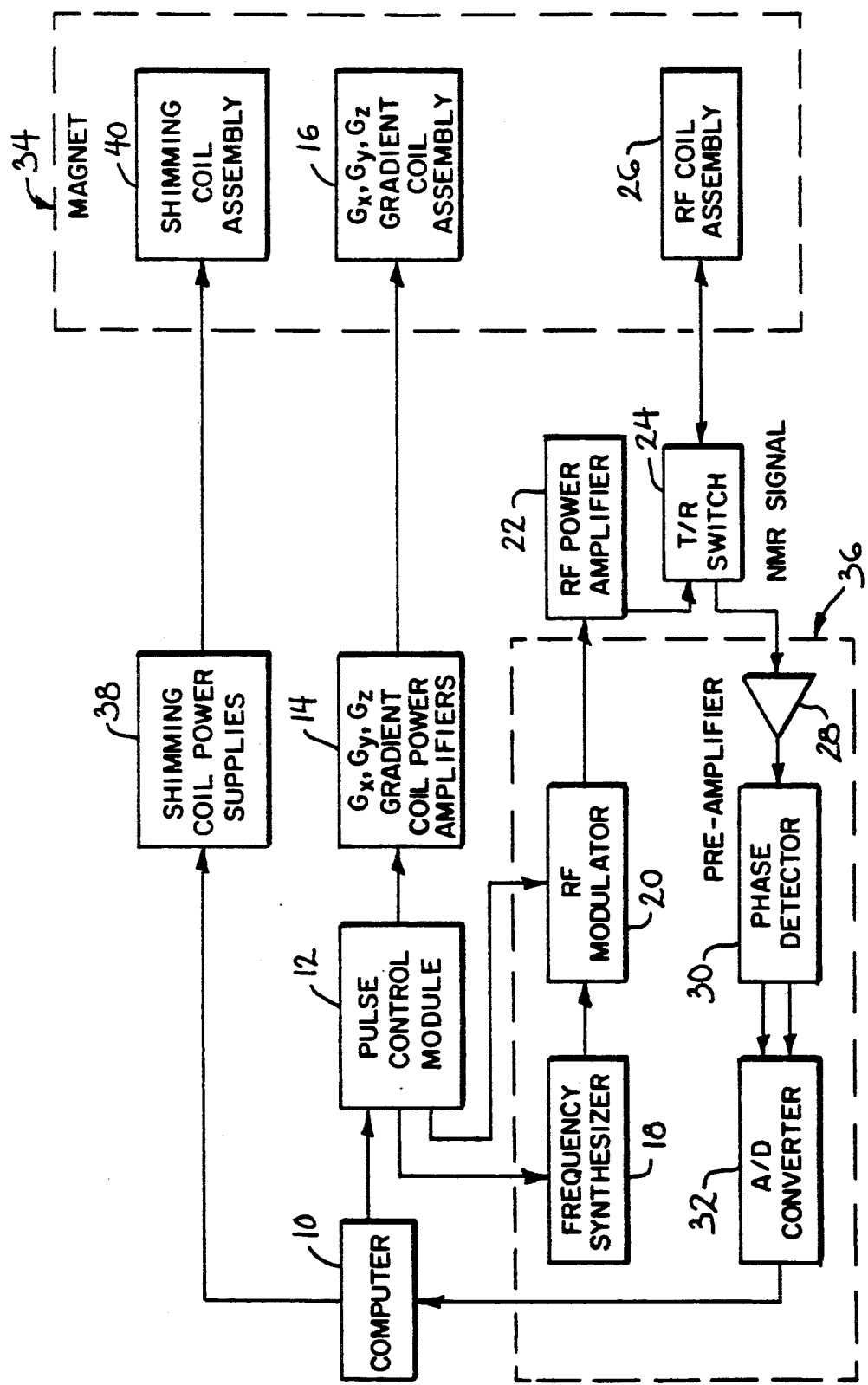
FIG. 1 is a schematic block diagram of an NMR system.

Referring to FIG. 1, an NMR imaging system of a type suitable for the practice of the invention includes a computer 10 which controls gradient coil power amplifiers 14 through a pulse control module 12. The pulse control module 12 and the gradient amplifiers 14 together produce the proper gradient waveforms $G_x$, $G_y$, and $G_z$, as will be described below, for a spin echo pulse sequence. The gradient waveforms are connected to gradient coils 40 which are positioned around the bore of the magnet 34 so that gradients $G_x$, $G_y$, and $G_z$ are impressed along their respective axes on the polarizing magnetic field $B_O$ from magnet 34.

The pulse control module 14 also controls a radio frequency synthesizer 18 which is part of an RF transceiver system, portions of which are enclosed by dashed line block 36. The pulse control module 12 also controls a RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by an high speed A/D converter 32 and applied to computer 10 for processing to produce NMR images of the object.

The following discussion considers a spin echo pulse sequence produced on the above described apparatus and suitable for use with the present invention. It should be understood, however, that the invention may be used with other pulse sequences as will be apparent to one skilled in the art.

Figure 2:
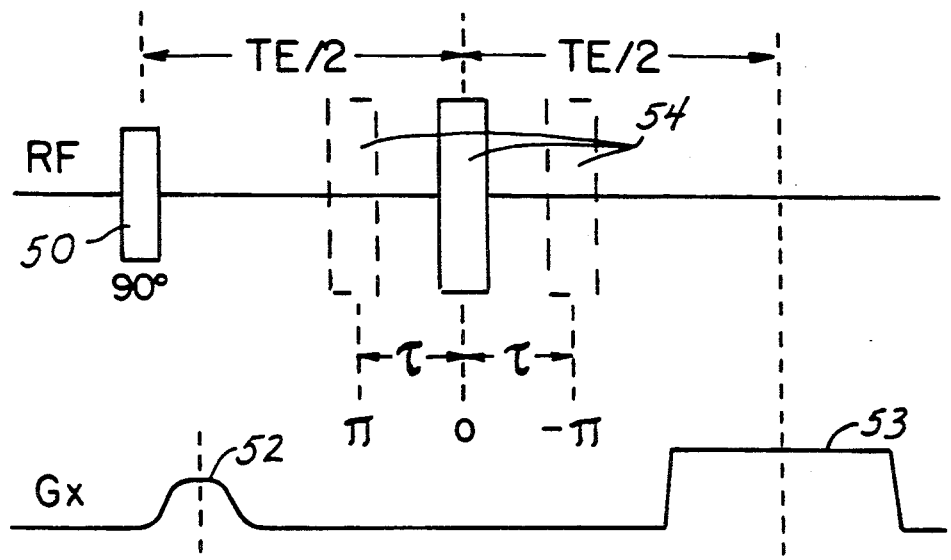
FIG. 2 is a graphic representation of a spin echo NMR pulse sequence such as may be produced on the NMR system of FIG. 1 and is suitable for use with the present invention.
Figure 2:
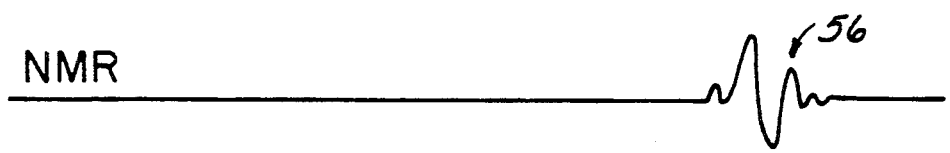
Figure 2:

Referring to FIG. 2, a spin echo pulse sequence begins with the transmission of a narrow bandwidth radio frequency (RF) pulse 50. The energy and the phase of this initial RF pulse 50 may be controlled such that at its termination, the magnetic moments of the individual nuclei are precessing around the z axis within the x-y plane. A pulse of such energy and duration is termed a 90° RF pulse.

The result of a combination of RF pulse 50 and a z axis gradient pulse $G_z$ (not shown) is that the nuclear spins of a narrow slice in the imaged object along an x-y plane are excited into resonance. Only those spins with a Larmor frequency, under the combined field $G_z$ and $B_O$, equal to the frequencies of the RF pulse 50 will be excited. Hence the position of the slice may be controlled by the gradient $G_z$ offset or the RF frequency.

After the 90° RF pulse 50, the precessing spins begin to dephase according to their chemical shifts which cause the spins of certain chemical species to precess faster than others. At time TE/2 after the application of 90° RF pulse 50, a 180° RF pulse 54 may be applied which has the effect of after the 90° RF pulse 50. This spin echo signal 56 is acquired during a read out gradient 53.

As is understood in the art, a dephaser pulse 52 is applied after the 90° RF pulse but before the read out gradient to center the spin echo within the read out gradient.

With the 180° RF pulse 54 centered at time TE/2 the fat and water proton spins will be completely rephased and hence have no phase shift with respect to each other at the time of the spin echo 56. This timing produces an $S_O$ signal. The time of the 180° pulse 54, however, may be shifted forward or back by time $\tau$ from the time TE/2. In this case, the fat and water proton spins will not be in phase but will be shifted with respect to each other by $2\tau\omega_{cs}$, where $\omega_{cs}$ is the difference in Larmor frequencies between water and fat. If $\tau$ is chosen to equal $\pi/2\omega_{cs}$ then the fat and water proton spins may be shifted by $\pi$ and $-\pi$ with respect to each other to create an $S_1$ and $S_{-1}$ signal.

The above sequences are repeated with different $G_y$ gradient pulses 57, as is understood in the art, to acquire three NMR data sets from which a tomographic images $S_O$, $S_1$ and $S_{-1}$ of the imaged object may be reconstructed according to conventional reconstruction techniques using the Fourier transform.

As mentioned above, a shortcoming to the technique of using three waveforms to decompose fat and water proton images is that the switch function s is not known. Referring to equations (5) and (6) it may be seen that the sign of the switch function s is may be determined by knowing the relative magnitudes of $\rho_1$ and $\rho_2$ and the information required to ascertain the relative magnitudes of $\rho_1$ and $\rho_2$ may be determined from equations (3') or (4'), i.e., by equation (4'):

$$(\rho_1 - \rho_2) = S_{-1}' e^{j(-\phi)} \qquad (7)$$

The value of $S_{-1}'$ is a known measured quantity, therefore, the relative magnitudes of $\rho_1$ and $\rho_2$, and hence the switch function value, may be determined if $\phi$ may be determined. As will be explained below, $\phi$ may be determined from a $B_O$ image equal to $S_1 S_{-1}^*$ provided $\phi$ is in the range of $\pm\pi/2$. To extend this range, two techniques are used to detect and correct "wrap arounds" of $\phi$ at the values of $\pm\pi/2$. The extended value of $\phi$ may be used to determined the switch function.

I. Determining the $B_O$ Image

Figure 3:
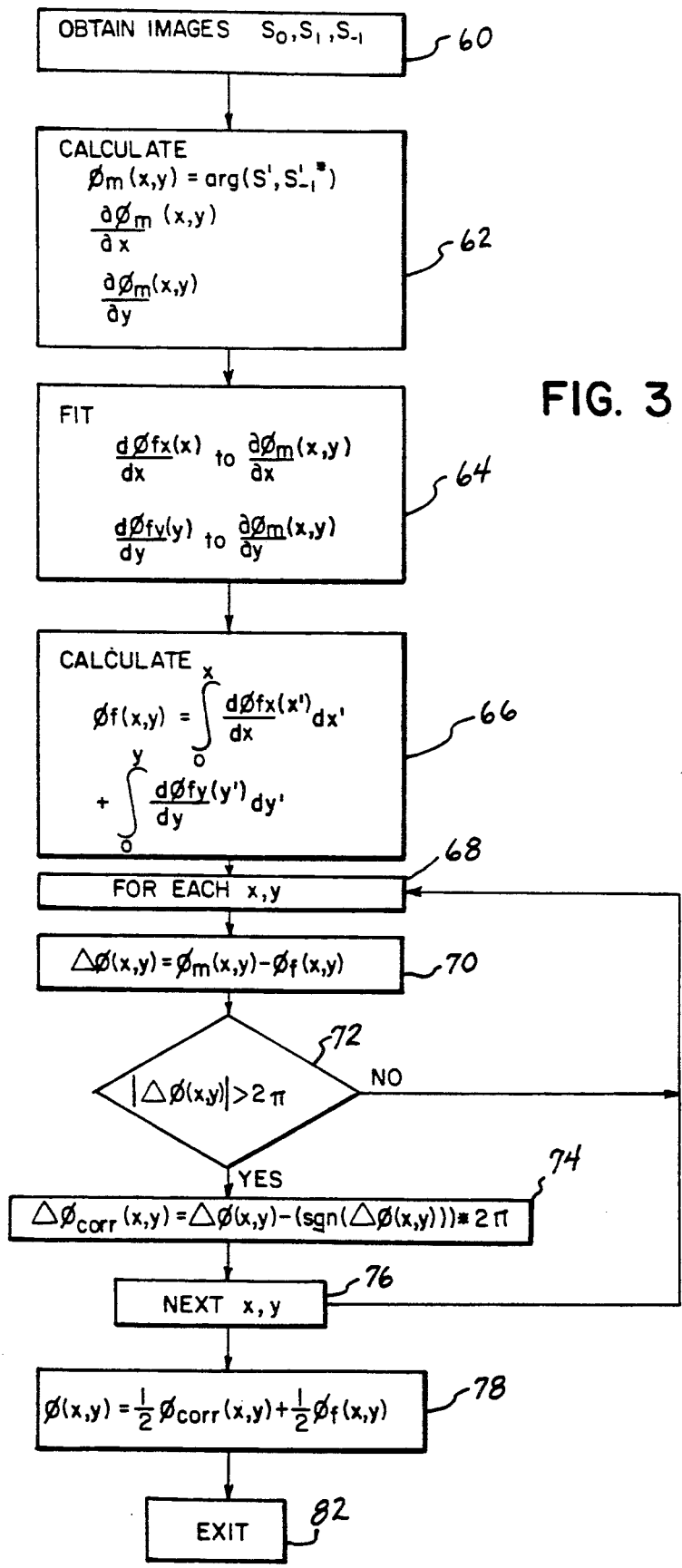
FIG. 3 is a flow chart showing the first stage of the method of the present invention for correcting the phase of the $B_O$ image so as to determine a switch function.

Referring to FIG. 3, the first step in determining the value of $\phi$ for each pixel is to obtain images $S_O$, $S_1$, and $S_{-1}$ comprised of pixels $S_O$, $S_1$, and $S_{-1}$ per process block 60. A $B_O$ image $\phi_m$ is then produced, per process block 62, by multiplying the image $S_1$ by the complex conjugate of the image $S_{-1}$ on a pixel by pixel basis and extracting the argument, i.e.

$$\phi m = arg(S_1' S_{-1}^*) = arg(S_1 S_{-1}^*) \qquad (8)$$

or by equations (3) and (4)

$$\phi m = arg([(\rho_1 - \rho_2) e^{j(\phi)}][(\rho_1 - \rho_2) e^{j(\phi)}]) \qquad (9)$$

$$\phi m = arg((\rho_1 - \rho_2)^2 e^{j2\phi}) \qquad (10)$$

hence, the $B_O$ image may be used to determine $\phi$ as:

$$\phi_m = 2\phi \qquad (11)$$

Figure 4A:
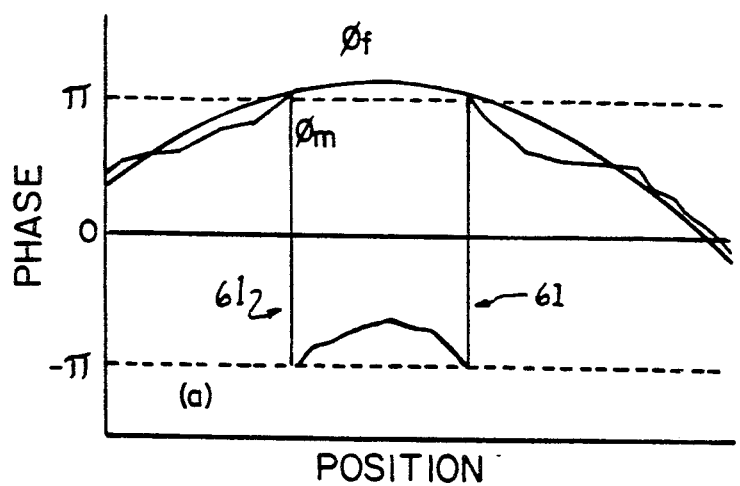
FIG. 4 is a plot of a single line of the $B_O$ image $\phi_m$ prior to the first stage of the correction method of the present invention and showing the fitted curve $\phi_f$.
FIG. 4(b) is a plot of a single line of the difference function $\Delta\phi$ equal to the $B_O$ image $\phi_m$ after subtraction of the curve $\phi_f$ and unambiguously showing the wrap around of $\phi_m$.
FIG. 4(c) is a plot of a single line of the corrected $B_O$ image $\phi_{corr}$ after correction by the first stage of the method of the present invention.

Note that the $B_O$ image $\phi_m$ is only uniquely determined if $|\phi| \leq \pi/2$ as a result of the periodicity of trigonometric functions. For angles $\phi$ greater than $\pi/2$ or less than $-\pi/2$, $\phi_m$ "wraps around" and $\phi$ is therefore ambiguous. As shown in FIG. 4(a), this wrap around 61 occurs at $\phi_m = \pi$ and $\phi_m = -\pi$ per equation (11). In general, this range of $\pi$ to $-\pi$ is too restrictive as it requires that the frequency shift caused by changes in $B_O$ be less than $\omega_{cs}/2$.

The wrap arounds 61 are removed by a two stage process, the first stage as shown in FIGS. 3 and 4(a)–(c) and the second stage shown in FIGS. 5–8.

II. Phase Correction by Polynomial Subtraction

Referring still to FIG. 3, as indicated by process block 62, the $B_O$ image is differentiated to produce differentiated images $$\frac{\partial \phi_m}{\partial x}, \frac{\partial \phi_m}{\partial y}.$$

In the differentiated images, the wrap arounds 61 will appear as large magnitude, narrow spikes which are readily identified by a thresholding process and given zero weight in the curve fitting to be described below.

A polynomial $\phi_f$ of the form:

$$\phi$$

is differentiated to produce:

$$\frac{d\phi_{fx}}{dx}(x) = 3p_3(x - x_0)^2 + 2p_2(x - x_0) + p_1 \qquad (12)$$

which is fit to the derivative of $\phi_m$ with respect to the x axis as indicated by process block 64. The value $x_O$ and corresponding value $y_O$ are the coordinates of the center of gravity of the image as will be described further below. This curve fitting is done by the weighted least squares method as is well understood in the art, where the weighting is a function of the amplitude of the $S_O'$ image at the particular pixel times the weighting produced by the thresholding process described immediately above. Coefficients are determined by averaging over all y-lines to produce the coefficients $p_3$, $p_2$, and $p_1$. The process is then repeated for lines of constant x value using the polynomial:

$$\frac{d\phi_{fy}}{dy}(y) = 3q_3(y - y_0)^2 + 2q_2(y - y_0) + q_1 \qquad (13)$$

At process block 66 the fit functions $$\frac{d\phi_{fx}}{dx}(x), \frac{d\phi_{fy}}{dy}(y)$$

are integrated to determine the coefficients of a third order polynomial $\phi_f$ of the form:

$$\phi_f(x,y) = a_3(x-x_0)^3 + a_2(x-x_0)^2 + a_1(x-x_0) + b_3(y-y_0)^3 + b_2(y-y_0)^2 + b_1(y-y_0) + c \qquad (14)$$

The value c is set equal to $\phi_m(x_O, y_O)$. This polynomial surface conforms to the undifferentiated $B_O$ image $\phi_m$ without regard to the wrap arounds 61 as shown in FIG. 4(a).

Process blocks 68 and 76 together form a loop containing process blocks 70–74 which sequentially correct each pixel of the $B_O$ image.

At process block 70, a difference function $\Delta\phi$ is computed as follows:

$$\Delta\phi = \phi_m \phi_f \qquad (15)$$

Figure 4B:
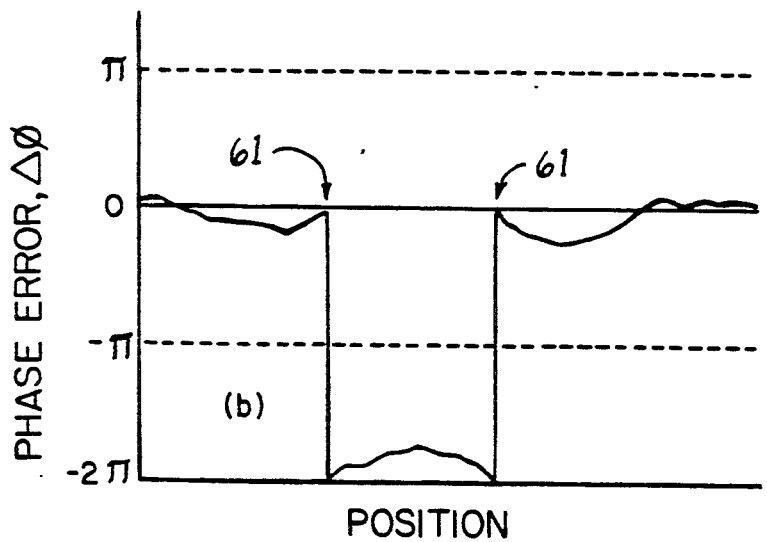
Figure 4C:
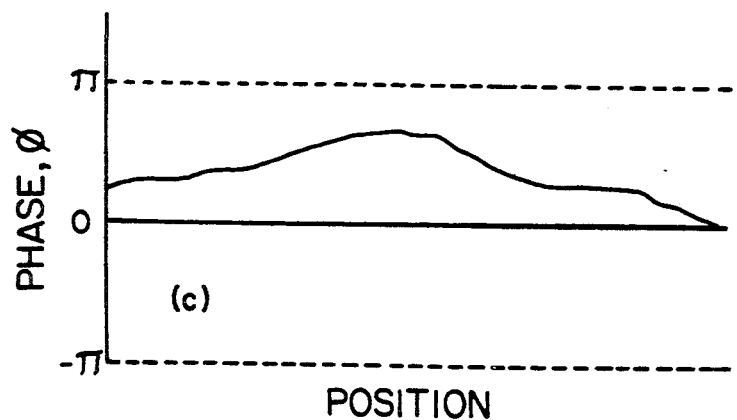

As shown in FIG. 4(b) in the function $\Delta\phi(x,y)$ the wrapped around points 61 are now unambiguous and may be detected at decision block 72 which identifies segments of $\Delta\phi$ having magnitudes of greater than $2\pi$, which are corrected at process block 74 by adding or subtracting $2\pi$ to the values of these segments depending on the sign of $\Delta\phi$ at these segments. A corrected image $\phi_{corr}$ is produced equal to $\Delta\phi$ without the wrap arounds 61. To determine $\phi$, the corrected image $\phi_{corr}(x,y)$ is halved and $$\frac{\phi_f(x,y)}{2}$$

is added at each pixel at process block 78 in accordance with equations 11 and 15 to produce phase image $\phi$ as shown in FIG. 4(c).

The above described method of determining the phase image $\phi(x,y)$ may fail for certain $B_O$ areas where the fit function $\phi_f(x,y)$ is not able to follow the spatially rapid phase changes or when the wrap arounds 61 of phase go beyond $2\pi$. For these reasons, the phase image $\phi(x,y)$ produced by the above described first stage is operated on by a second stage of the process as will now be described.

III. Phase Correction Using Trend Analysis

In the second stage, the phase of each pixel of the phase image is predicted by an exponential prediction based on the previous pixels. Deviations between the prediction and the actual measured phase are used to detect previously undetected wrap around points 61 and the "wrapped around" pixels are "unwrapped" by adding or subtracting $2\pi$.

Figure 5:
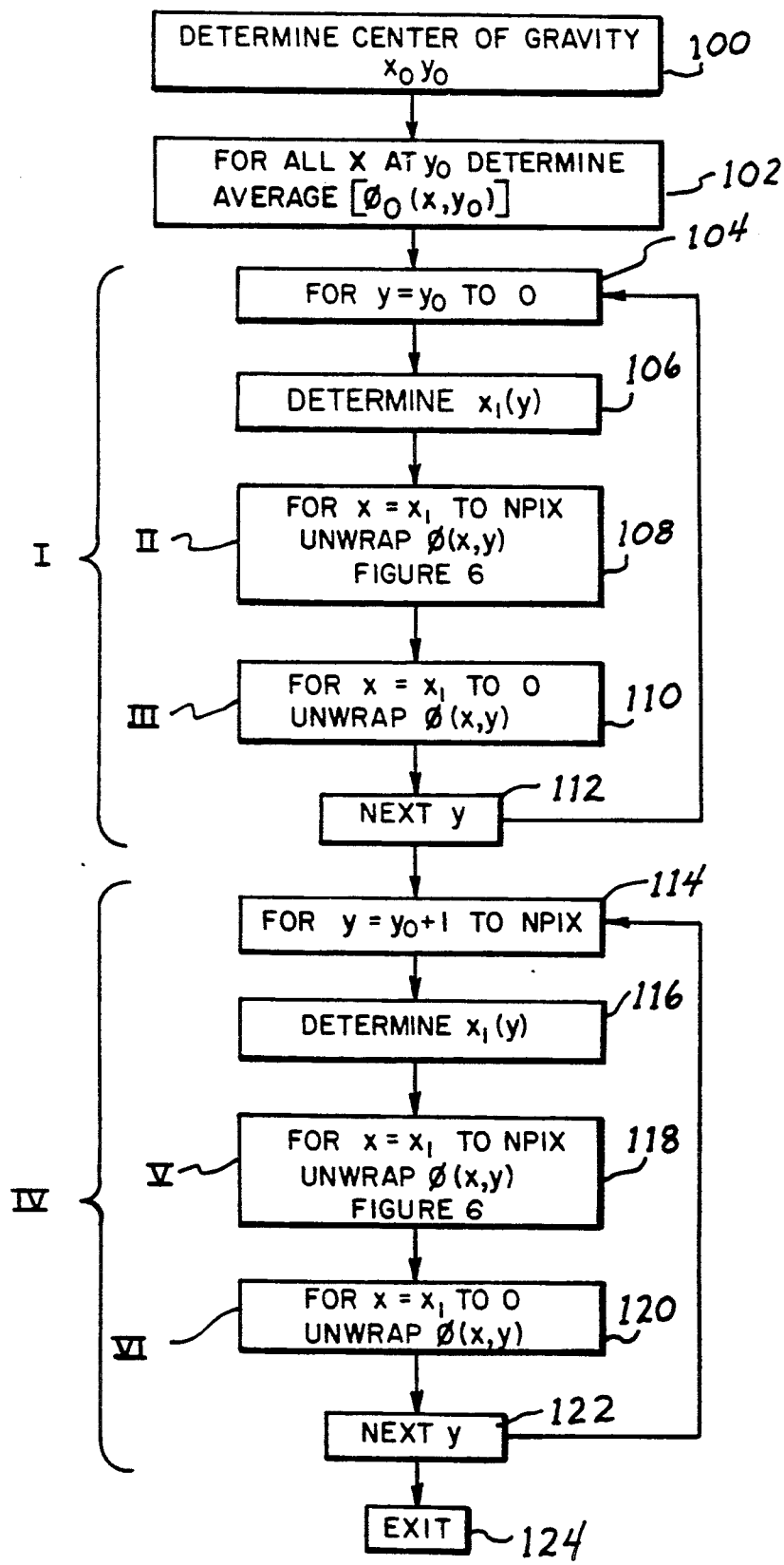
FIG. 5 is a flow chart showing the second stage of the method of the present invention for correcting the $B_O$ image to be used to determine a switch function.

Referring to FIG. 5 and 7, in the first step of the second stage, as indicated by process block 100, the center of gravity $(x_O, y_O)$ of the amplitude of the $S_O'$ image is found.

Specifically $x_O$ and $y_O$ are calculated where:

$$x_0 = \frac{\int |S_0'| \, x \, dxdy}{\int |S_0'| \, dxdy} \text{ and} \qquad (16)$$

$$y_0 = \frac{\int |S_0'| \, y \, dxdy}{\int |S_0'| \, dxdy} \qquad (17)$$

The point of maximum phase, $x_1$, along the line of constant y intersecting the center of gravity ("$y_O$-line"), is then identified and the value of $\phi(x,y_O)$ along this line is determined as follows. Starting at the pixel of maximum intensity at $y_O$, $(x_1, y_O)$, as the current pixel, the average phase in a 3 by 3 pixel matrix $(x_1 - 1 \leq x \leq x_1 + 1, y_O - 1 \leq y \leq y_O + 1)$ is determined by averaging. Care is taken to avoid wrap around discontinuities by performing a second average with $\pi$ offset added to each pixel, adjusting the result to within the range of $\pm\pi$ by adding or subtracting $2\pi$ in a average with the smallest $\chi^2$ fit to a planar surface defined by the previous averages. The value of the phase determined by this method becomes the starting phase $\phi_O$ for pixel $x_1$, $y_O$.

Progressive y-lines are then unwrapped starting from the line at $y_O$ and at point $x_1$ for that line. Referring to FIG. 8, these lines are analyzed at and below the $y_O$-line per the loop formed by process blocks 104 and 112 which sequentially decrements the y value of the line to be unwrapped. Again the maximum phase value $x_1$ on each line is determined as indicated by process block 106 within this loop and the line is unwrapped from the pixel $x_1$ rightward to the image boundary as indicated by arrow II of FIG. 8, and by process block 108 of FIG. 5, and then leftward from pixel $x_1$ as indicated by arrow III of FIG. 8 and process block 110 of FIG. 5. The next lower y-line is then unwrapped and the process is repeated proceeding in the direction shown by arrow I of FIG. 8 according to the loop of process blocks 104 and 112 of FIG. 5 as previously described.

When the lower portion of the image is unwrapped, successive y-lines above the $y_O$-line are unwrapped according to a loop formed by process blocks 114 and 122 of FIG. 5.

The center of gravity and the maximum phase value $x_1$ on each line is determined as indicate by process block 116. For each such y-line the phase is unwrapped first along the direction indicated by arrow V of FIG. 8 away from pixel $x_1$ according to process block 118 of FIG. 5, and then in the direction indicated by arrow VI of FIG. 8 according to process block 120 of FIG. 5. The process is repeated for higher y-lines as indicated by arrow IV of FIG. 8 according to the loop of process blocks 114 and 122 of FIG. 5 until the upper edge of the image is reached.

Figure 6:
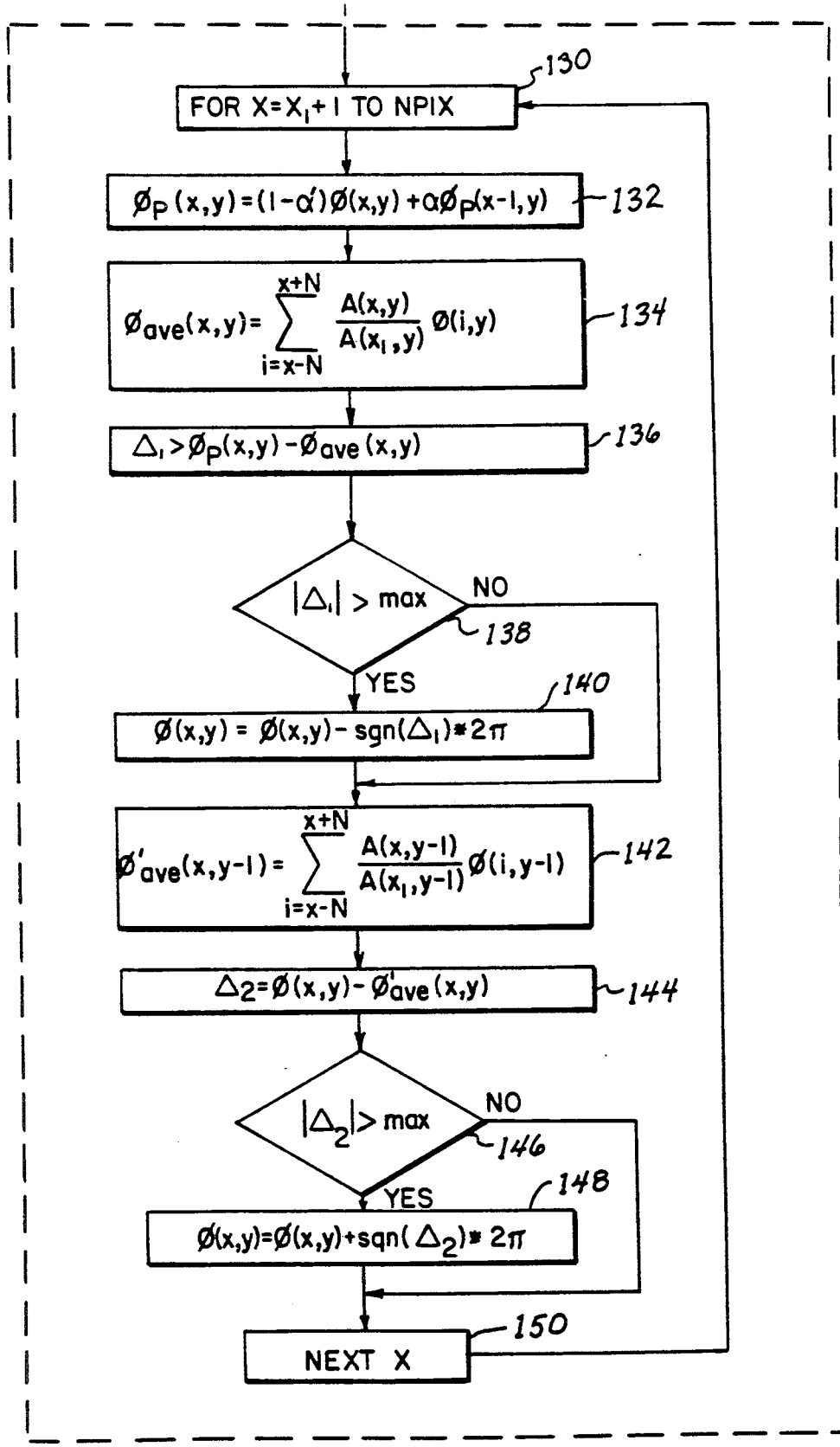
FIG. 6 is a detailed flow chart showing a representative unwrapping stage of FIG. 5.

Referring to FIG. 6, the unwrapping process of process block 108, as is representative of the processes used in process blocks 110, 118 and 120, examines the phase of each pixel on the given y line starting at pixel adjacent to pixel $x_1$. This examination is controlled by a loop formed by process blocks 130 and 150. The first step within this loop as indicated by process block 132 is to predict the phase $\phi_p$ at the current pixel by reference to the previous pixel as follows:

$$\phi_p(x,y) = (1-\alpha')\phi(x,y) + \alpha'\phi_p(x-1, y) \quad (18)$$

wherein $1-\alpha' = (1-\alpha)[(|S_0'(x,y)|/|S_0'(x_m,y)|)] \quad (19)$ $\alpha = 0.6$
and $\quad (20)$ $x_m$ is the pixel on the current line of maximum amplitude $|S_0'|$. This step is a weighted trend prediction.

It will be apparent to those of ordinary skill in the art that other values of $\alpha$ may be selected such that $0 \leq \alpha \leq 1$ where larger values of $\alpha$ will provide a prediction $\phi_p$ that conforms more slowly to the actual measured phase $\phi$. The weighting of $\alpha$ by the amplitude of the image $|S_0'|$ causes the prediction $\phi_p$ to use little of the immediate phase information of $\phi$ when the amplitude is small and instead retains the average from the preceding pixels where the amplitude is high, and thus enables the trend of the phase to be tracked even across a "hole" in the image where the signal is low.

As indicated by process block 134, a rolling weighted average $\phi_{ave}$ of the current phase $\phi$ is maintained for a window of pixels of empirically determined width $2N = 12$ centered about the current pixel x as follows:

$$\phi_{ave}(x,y) = \sum_{i=x-N}^{x+N} \frac{|S_0'(x,y)|}{|S_0'(x_1,y)|} \phi(i,y) \quad (21)$$

This average is compared to the predicted value $\phi_p$ to generate a first error value $\Delta_1$ as follows:

$$\Delta_1(x,y) = \phi_p(x,y) - \phi_{ave}(x,y) \quad (22)$$

A large value of $\Delta_1$ will indicate a wrap around and hence at decision block 138 if the value of $\Delta_1$ exceeds a predetermined maximum value of $\pi$, then at process block 140, the current phase $\phi$ is unwrapped by adding or subtracting $2\pi$ as follows:

$$\phi(x,y) = \phi(x,y) - sgn(\Delta_1(x,y)) \cdot 2\pi \quad (23)$$

In either case at process block 142 a weighted average $\phi_{ave}'$ is computed for the corresponding pixels on the preceding y-line as follows:

$$\phi_{ave}'(x,y) = \sum_{i=x-N}^{x+N} \frac{|S_0'(x,y)|}{|S_0'(x_1,y)|} \phi(i,y-1) \quad (24)$$

This average is compared to the current phase value $\phi$ value to generate a second error value $\Delta_2(x,y)$ as follows:

$$\Delta_2(x,y) = \phi(x,y) - \phi_{ave}'(x,y) \quad (25)$$

A large value of $\Delta_2(x,y)$ will indicate an additional wrap around and hence at decision block 146 if the value of $\Delta_2$ is not close to zero, i.e. is less than $\pi$ in magnitude, for example, then at process block 148, the current phase $\phi$ is unwrapped by adding or subtracting $2\pi$ as follows:

$$\phi(x,y) = \phi(x,y) - sgn(\Delta_2(x,y)) \cdot 2\pi \quad (26)$$

The next pixel is then examined and the process is repeated per the loop formed by process blocks 130 and 150 as described.

IV. Determination of the Switching Function

With $\phi(x,y)$ known, the switch function s may be determined from equation (4) in principle as $$s = sng(\rho_1 - \rho_2) = sgn(S_{-1}'e^{i\phi}) \quad (27)$$

For convenience, a continuous switch angle $\theta$ may be defined as:

$$\theta = arg(S_{-1}'e^{i\phi}) \quad (28)$$

The value of $\theta$ will approximate $-\pi$ or $\pi$ depending on the predominance of $\rho_1$ over $\rho_2$. It has been determined that a continuous switch function avoids the generation of artificial "contour" lines at fat/water borders. Hence a continuous switch function s' may be chosen as:

$$s' = \cos(\theta) \quad (29)$$

although some other function could be chosen.

While this invention has been described with reference to particular embodiments and examples, other modifications and variations, such as application to projection reconstruction imaging techniques, will occur to those skilled in the art in view of the above teachings. For example, the switch function may be determined from $\phi(x,y)$ immediately after the first stage of the correction process or alternatively the second stage of the correction process may be used alone. Also, the technique may be used for chemical species other than fat and water. Accordingly, the present invention is not limited to the preferred embodiment described herein, but is instead defined in the following claims.

We claim:

1. A method of producing separate images of a first chemical species and a second chemical species in an imaged body, from three complex NMR multi-pixel images $S_O$, $S_1$, and $S_{-1}$ of the body, the first and second chemical species having relative phase shifts of 0, $\pi$, and $-\pi$ in the three images, $S_O$, $S_1$, and $S_{-1}$ respectively, comprising the steps of:

combining the NMR images to create a $B_O$ image;
   fitting a low order surface to the continuous portions of the $B_O$ image;
   measuring the difference between the low order surface and the $B_O$ image;
   correcting the phase of the $B_O$ image if the difference between adjacent pixels exceeds a predetermined value;
   producing a switch function dependant on the corrected $B_O$ image; and
   combining the NMR multi-pixel images to produce a first and second chemical species image using the switch function to identify the predominant chemical species of each pixel in the chemical species images.

2. The method of claim 1 wherein the fitting of the low order surface to the continuous portions of the $B_O$ image comprises the following steps:

differentiating the $B_O$ image to produce a differentiated image;
   producing a weighting function by comparing the value differentiated image at each pixel to a predetermined threshold and setting the weighting function for that pixel equal to zero if that threshold is passed;
   fitting a differentiated polynomial to the differentiated $B_O$ image using the weighting function in a weighted curve fitting process; and
   integrating the differentiated polynomial to produce the low order surface.

3. The method of claim 2 wherein the constant of integration from integrating the differentiated polynomial is set equal to the measured phase at the maximum amplitude pixel for the line at the center of mass in the perpendicular direction of the image.

4. The method of claim 2 wherein the weighting function is proportional to the amplitude of a complex NMR image if the threshold is not passed.

5. The method of claim 1 where the $B_O$ image is produced by multiplying image $S_1'$ times the complex conjugate of image $S_{-1}'$ on a pixel by pixel basis and taking the argument of that product where $$S_O' = S_O e^{-i\phi_O}$$

$$S_1' = S_1 e^{-i\phi_O}$$

and $$\phi_O = S_O'/|S_O'|.$$

6. The method of claim 1 where the low order surface is a third order polynomial.

7. The method of claim 1 wherein the combination of the NMR multi-pixel images produces a first and second chemical species image with the pixels of the first chemical species image having an amplitude proportional to $\rho_1$ and the pixels of the second chemical species image have an amplitude proportional to $\rho_2$ where:

$$\rho_1 = (S_O' + s\sqrt{S_1'S_{-1}'})/2$$

$$\rho_2 = (S_O' - s\sqrt{S_1'S_{-1}'})/2$$

and $$S_O' = S_O e^{-i\phi_O} = (\rho_1 + \rho_2)$$

$$S_1' = S_1 e^{-i\phi_O} = (\rho_1 - \rho_2)e^{i(\phi)}$$

$$S_{-1}' = S_{-1} e^{-i\phi_O} = (\rho_1 - \rho_2)e^{-i(\phi)}$$

$$\phi_O S_O'/|S_O'|$$

and where s is the switch function.

8. The method of claim 1 where the switch function for each pixel equals $\text{sgn}(S_{-1}'e^{i\phi})$ where $\phi$ is the corrected $B_O$ image for that pixel.

9. The method of claim 1 where the switch function for each pixel equals $\cos(S_{-1}'e^{i\phi})$ where $\phi$ is the corrected $B_O$ image for that pixel.

10. A method of producing separate images of a first chemical species and a second chemical species in an imaged body from three complex MR multi-pixel images $S_O$, $S_1$, and $S_{-1}$ of the body, the first and second chemical species having relative phase shifts of 0, $\pi$, and $-\pi$ in the three images, $S_O$, $S_1$, and $S_{-1}$ respectively, comprising the steps of:

(a) combining the images to create a multi-pixel, two axis $B_O$ image;
   (b) identifying a starting pixel in the $B_O$ image with an initial phase value;
   (c) predicting the phase value of a neighbor pixel to the starting pixel;
   (d) comparing the predicted phase value to the actual phase value of the neighbor pixels;
   (e) correcting the phase of the neighbor pixel by $2\pi$ if the predicted value differs from the actual value by more than a predetermined threshold to produce a corrected phase value;
   (f) repeating steps (a)-(e) with a neighbor pixel becoming the starting pixel until a corrected phase value has been obtained over the entire image;
   (g) producing a switch function dependant on the twice corrected phase value; and
   (h) combining the $S_O$, $S_1$ and $S_{-1}$ images to produce a first and second chemical species image using the switch function to identify each pixel in the first and second chemical species images to a chemical species.

11. The method of claim 10 wherein the starting point is the maximum amplitude pixel for the line at the center of mass in the perpendicular direction of the image.

* * * * *

UNITED STATES PATENT AND TRADEMARK OFFICE
CERTIFICATE OF CORRECTION

PATENT NO. : 5,144,235

DATED : September 1, 1992

INVENTOR(S) : Glover et al.

It is certified that error appears in the above-identified patent and that said Letters Patent is hereby corrected as shown below:

| | |
|---|---|
| Col. 2, line 55 | "$(p_1-p_2)e^1$" should be -- $(p_1-p_2)e$ --. |
| Col. 3, line 7 | "$-e\phi 0$" should be -- $-i\phi 0$ -- |
| Col. 5, line 6 | "$S_0$" should be -- $S_0'$ -- |
| Col. 6, line 4 | after "of" and before "after" insert --of rephasing the spins to produce a spin echo 56 at time TE--. |
| Col 6, line 22 | "x and $-\pi$" should be -- $\pi$ and $-\pi$ -- |
| Col. 8, line 68 | After "$2\pi$ in a" and before "average" insert -- manner analogous to steps 70, 72, and 74 and choosing the -- |

Signed and Sealed this

Nineteenth Day of October, 1993

Attest:

BRUCE LEHMAN

Attesting Officer     Commissioner of Patents and Trademarks